(12) United States Patent
Dribinski

(10) Patent No.: US 9,023,152 B2
(45) Date of Patent: May 5, 2015

(54) CLBO CRYSTAL GROWTH

(75) Inventor: Vladimir L. Dribinski, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 1243 days.

(21) Appl. No.: 12/875,233

(22) Filed: Sep. 3, 2010

(65) Prior Publication Data

US 2015/0007765 A1  Jan. 8, 2015

Related U.S. Application Data

(60) Provisional application No. 61/243,278, filed on Sep. 17, 2009.

(51) Int. Cl.
*C30B 15/02* (2006.01)
*C30B 15/14* (2006.01)

(52) U.S. Cl.
CPC ............... *C30B 15/02* (2013.01); *C30B 15/14* (2013.01)

(58) Field of Classification Search
CPC ........ C30B 15/02; C30B 15/18; C30B 15/22; C30B 29/22
USPC ........................................ 117/13, 15, 17, 945
See application file for complete search history.

(56) References Cited

U.S. PATENT DOCUMENTS 7,416,603 B2 *  8/2008  Cho .............................. 117/13
7,627,007 B1 *  12/2009  Armstrong et al. ............. 372/21

* cited by examiner

*Primary Examiner* — Bob M Kunemund
(74) *Attorney, Agent, or Firm* — Luedeka Neely Group, P.C.; Rick Barnes

(57) ABSTRACT

A solution-stirring top-seeded solution-growth method for forming CLBO of the type where water is added to a precursor mixture, where heavy water is substituted for the water.

5 Claims, 1 Drawing Sheet

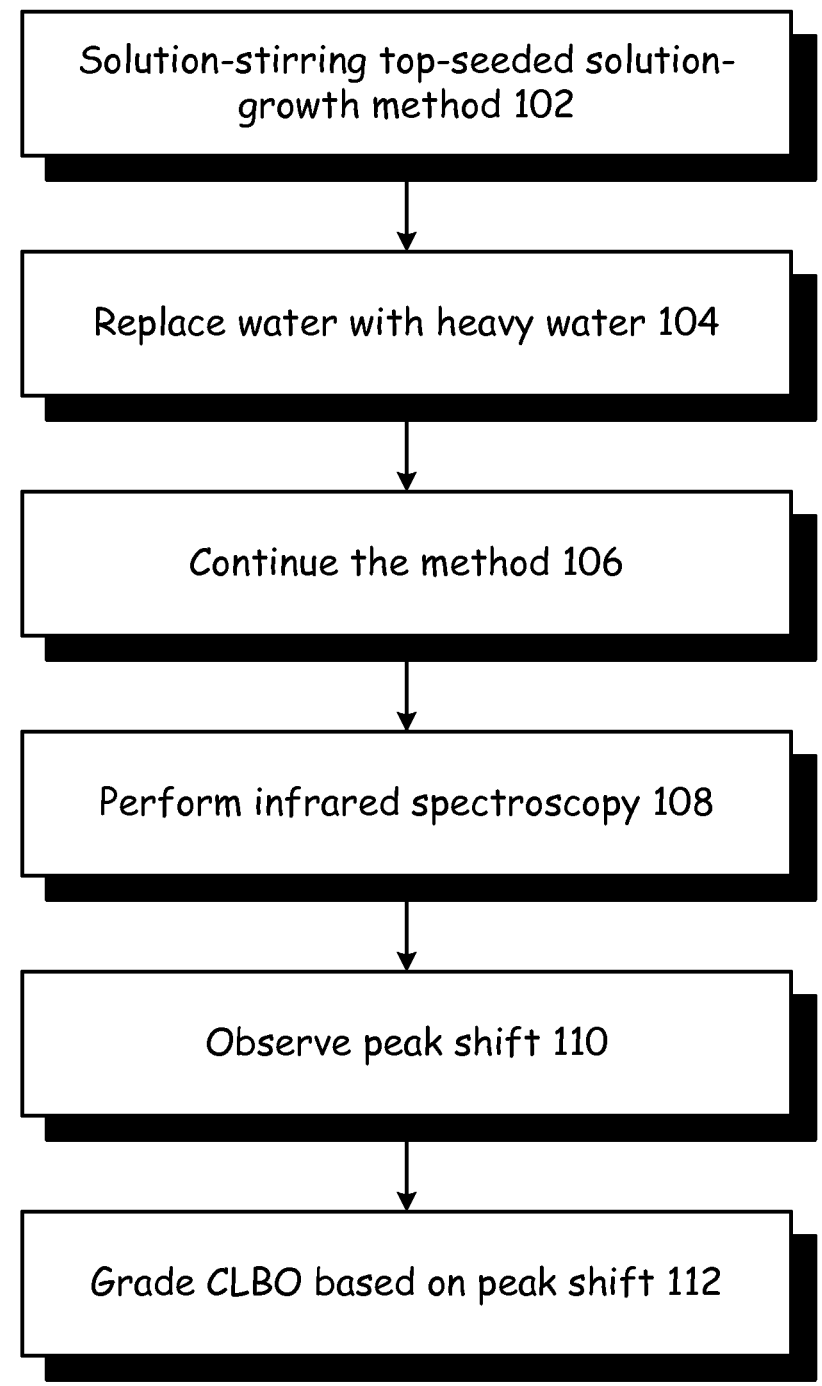

CLBO CRYSTAL GROWTH

FIELD

This application claims all rights and priority on prior U.S. provisional patent application Ser. No. 61/243,278 filed 2009 Sep. 17. This invention relates to the field of crystal growth. More particularly, this invention relates to detecting and removing hydroxide impurities during the formation of CLBO crystals.

INTRODUCTION

In recent years, $CsLiB_6O_{10}$ (CLBO) crystals have became the non-linear material of choice for frequency conversion in instruments that produce high-power deep ultraviolet radiation using diode-pumped solid-state lasers and fiber lasers. CLBO is superior to BBO, a traditional non-linear crystal for ultraviolet generation, in several respects. It possesses a shorter ultraviolet absorption edge (180 nanometers for CLBO versus 189 nanometers for BBO), larger angular, spectral, and temperature bandwidths, and a higher conversion efficiency. In addition, laser-induced damage thresholds of CLBO crystal are higher than those of BBO.

Crystal imperfections, such as structural defects and impurities, can greatly reduce CLBO lifetime, especially at deep ultraviolet wavelengths. Therefore, the crystal growth process is of crucial importance. Typically, CLBO crystals are grown from stoichiometric or near-stoichiometric mixtures using either Czochralski or top seeded solution growth techniques. Two major improvements have been introduced that allowed production of high-quality CLBO.

The first breakthrough came with development of the solution-stirring top seeded solution growth method. In this method, a special propeller is inserted into the crucible with the melt, and the crucible is slowly rotated during crystal growth. This improves mixing and mass transport within the melt (which has a very high viscosity), and produces CLBO crystals with lower defect concentrations and higher laser-induced damage thresholds.

The second improvement is related to melt preparation. Direct mixing of precursor materials ($Cs_2CO_3$, $Li_2CO_3$, $B_2O_3$) in a crucible results in a non-uniform melt that exhibits different phases. Sintering of starting reagents is difficult because of the large volume of the material, and swelling of the material due to decarboxylation. A different approach is to mix the starting reagents in an aqueous solution, and subsequently vaporize the water and sinter the mixture at a high temperature. This melt preparation procedure substantially improves CLBO crystal quality and, thus, became a standard first step in the crystal growth process.

However, mixing of the initial reagents in water tends to create an additional problem by introducing hydroxide-based impurities. Cesium and lithium carbonates decompose in water releasing carbon dioxide and forming hydroxides of cesium and lithium in the solution, as given below:

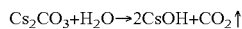
$Cs_2CO_3 + H_2O \rightarrow 2CsOH + CO_2 \uparrow$

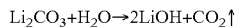
$Li_2CO_3 + H_2O \rightarrow 2LiOH + CO_2 \uparrow$

In the resultant basic solution, boron trioxide ($B_2O_3$) reacts with water to form tetrahydroxoborate, as given below:

$B_2O_3 + 3H_2O + 2OH^- \rightarrow 2B(OH)_4^-$ and, further, polyhydroxoborates, as given below:

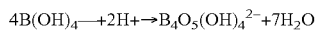
$4B(OH)_4^- + 2H^+ \rightarrow B_4O_5(OH)_4^{2-} + 7H_2O$

Therefore, upon vaporization, the mixture is contaminated with hydroxide compounds such as CsOH, LiOH, $Cs_2[B_4O_5(OH)_4]$, and $Li_2[B_4O_5(OH)_4]$. Sintering at high temperature might not be sufficient to fully decompose these contaminants and completely remove the hydroxide groups, because these compounds are thermally very stable. For example, the decomposition temperature of lithium hydroxide is 942 centigrade and the decomposition temperature of cesium hydroxide is expected to be even higher. Therefore, such compounds will not decompose during the melt preparation and crystal growth that typically occurs at temperatures of about 845-850 degrees Celsius.

The presence of hydroxide compounds in the melt tends to result in hydroxide impurities inside the CLBO crystal. Such impurities can increase ultraviolet absorption in the crystal, by creating three additional absorption pathways, as described below:

1. Direct one-photon absorption. The free hydroxide radical has a strong ultraviolet absorption band at about 310 nanometers (X→A electronic transition), while in the condensed phase another band at about 230 nanometers has been observed, and is assigned to hydrogen-bonded hydroxide. Thus, introduction of hydroxide fragments into the crystal results in the appearance of one-photon absorption in the ultraviolet region that is completely transparent in ideal CLBO, whose band gap of about 6.9 electron-volts corresponds to a one-photon absorption cutoff of about 180 nanometers.

2. Increased two photon absorption. The hydroxide radical creates impurity levels within the CLBO band gap that act as intermediate states during two-photon absorption. This increases the probability of two-photon absorption for wavelengths that are longer than the band gap value, as compared to a pure CLBO crystal, where such transitions only occur via virtual levels.

3. Vibrationally assisted UV absorption. The characteristic feature of all hydrogen-containing compounds is a relatively high vibrational frequency that is caused by the relatively small mass of the hydrogen atom. In the free hydroxide radical, the fundamental vibrational frequency (stretch) is 3738 reciprocal centimeters, and in most other hydroxide substances this frequency lies between about 3200 and about 3900 reciprocal centimeters. Spectra of CLBO crystals that are grown using the aqueous solution mixing technique exhibit a peak at about 3400 reciprocal centimeters that does not disappear upon prolonged heating at 150-200 centigrade, and can not be attributed to water molecules inside the crystal. Such high-energy vibrations can more easily couple to electronic motions, creating the possibility for vibronic transitions. For such transitions to occur at wavelengths that are longer than the band gap value, non-zero vibrational overtone population is required. Although at room temperature the overtone population of such high-energy vibration is small, it is not negligible. Moreover, in many cases CLBO is used at significantly higher temperatures (typically about 150 centigrade), so that the overtone population is much higher, scaling according to the Boltzmann exponential.

What is needed, therefore, is a system that reduces problems such as those described above, at least in part.

SUMMARY OF THE CLAIMS

The above and other needs are met by a solution-stirring top-seeded solution-growth method for forming CLBO of the type where water is added to a precursor mixture, where heavy water is substituted for the water.

This substitution of heavy water for the water has at least two benefits. First, deuterium oxide from the heavy water tends to be included in the CLBO to a lesser extent than does hydrogen oxide from the water, thereby producing a more pure CLBO crystal having more desirable properties. Further, a shift in the infrared absorption spectra provides a good test of the degree of impurity inclusion from the process.

According to another aspect of the invention there is described a method for testing CLBO for solution inclusion when the CLBO is formed using a solution-stirring top-seeded solution-growth method. Heavy water is used instead of water in the solution-stirring top-seeded solution-growth method, and infrared spectroscopy is performed on the CLBO. A shift in an infrared absorption peak of the CLBO from about 3400 reciprocal centimeters to about 2500 reciprocal centimeters is detected, and the CLBO is graded based at least in part on a degree of the shift in the infrared absorption peak. Alternately, some other composition analysis method, such as secondary ion mass spectrometry, is used to detect deuterium in the CLBO.

According to yet another aspect of the invention there is described a method for reducing hydrogen inclusion in CLBO by adding heavy water instead of water to a precursor mixture, and performing a solution-stirring top-seeded solution-growth method for forming the CLBO.

BRIEF DESCRIPTION OF THE DRAWING

Further advantages of the invention are apparent by reference to the detailed description when considered in conjunction with the FIGURE, which is not to scale so as to more clearly show the details, wherein like reference numbers indicate like elements, and which depicts a flow chart for a method according to an embodiment of the present invention.

DETAILED DESCRIPTION

The embodiments of the method according to the present invention, as described below, determine whether hydroxide contamination is significant and, in some embodiment, reduce its effect.

With reference now to the FIGURE, there is depicted a flow-chart for a method 100 according to one embodiment, which is based on a solution-stirring top-seeded solution-growth method for forming CLBO, as given in block 102. Isotopic substitution (greater than about 99.8%) of hydrogen by deuterium in the water solution is used to obtain an aqueous solution during the melt preparation step, as given in block 104. This substitution replaces the $H_2O$ with $D_2O$, or so-called heavy water. With no other source for hydrogen atoms during the crystal growth, the resultant CLBO crystal contains deuterium oxide instead of hydroxide if, in fact, any contamination takes place. With the exception of this substitution of heavy water for water, the method continues as usual, as given in block 106.

One difference between hydroxide and deuterium oxide groups is their vibrational frequencies. The reduced mass for the stretch in deuterium oxide is almost double that of hydroxide. The fundamental frequency in free deuterium oxide is only about 2720 reciprocal centimeters, compared to about 3738 reciprocal centimeters in hydroxide. Thus, when infrared spectroscopy is performed on the resultant CLBO, as given in block 108, a red shift in some of the infrared absorption peaks of CLBO due to water isotopic substitution indicates the presence of deuterium oxide and hydroxide groups. In particular, the peak at about 3400 reciprocal centimeters, as mentioned in the introduction, should shift to about 2500 reciprocal centimeters, as given in block 110. The CLBO can be graded according to the degree of the shift and the strength of the peaks.

Secondary ion mass spectrometry can also be used to determine the amount of deuterium inside the crystal, which is an indicator of the level of hydroxyl contamination caused by mixing in the solution. Secondary ion mass spectrometry is not suitable for the determination of the regular hydroxyl radical (OH), due to large amounts of hydrogen in the CLBO crystal caused by absorption of atmospheric water. Due to a low natural abundance of the deuterium atom, such atmospheric water absorption will not affect deuterium detection sensitivity.

Substitution of water with heavy water can also result in a reduced effect on CLBO crystal growth and properties.

First, deuterium-substituted compounds are known to sometimes display substantially different chemical reactivity. Consequently, the formation rate and thermal stability of deuterium oxide in the melt may be less than that of hydroxide, which results in a more pure CLBO crystal. The penetration of deuterium oxide into the CLBO crystal during the growth is also expected to be different.

Second, because of the lower vibrational energy, potential vibronic interactions are weaker for CLBO crystals with deuterium oxide impurities, in comparison to CLBO crystals that are contaminated with hydroxide. This reduces vibrationally-assisted absorption and can improve ultraviolet transmission, especially at elevated temperatures and wavelengths that are close to the band gap value, or less than about 200 nanometers.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. In a solution-stirring top-seeded solution-growth method for forming CLBO of the type where water is added to a precursor mixture, the improvement comprising substituting heavy water for the water.

2. A method for testing CLBO for solution inclusion when the CLBO is formed using a solution-stirring top-seeded solution-growth method, the method comprising the steps of using heavy water instead of water in the solution-stirring top-seeded solution-growth method, performing infrared spectroscopy on the CLBO, detecting a shift in an infrared absorption peak of the CLBO from about 3400 reciprocal centimeters to about 2500 reciprocal centimeters, and grading the CLBO based at least in part on a degree of the shift in the infrared absorption peak.

3. A method for testing CLBO for solution inclusion when the CLBO is formed using a solution-stirring top-seeded solution-growth method, the method comprising the steps of using heavy water instead of water in the solution-stirring top-seeded solution-growth method, performing composition analysis on the CLBO to determine an amount of deuterium in the CLBO.

4. The method of claim 3, wherein the composition analysis comprises secondary ion mass spectrometry.

5. A method for reducing hydrogen inclusion in CLBO, the method comprising the steps of adding heavy water instead of water to a precursor mixture, and performing a solution-stirring top-seeded solution-growth method for forming the CLBO.

* * * * *